(12) United States Patent
Chang

(10) Patent No.: US 10,943,870 B2
(45) Date of Patent: Mar. 9, 2021

(54) MICROPHONE PACKAGE STRUCTURE

(71) Applicant: MERRY ELECTRONICS (SHENZHEN) CO., LTD., Guangdong (CN)

(72) Inventor: Chao-Sen Chang, Taichung (TW)

(73) Assignee: MERRY ELECTRONICS (SHENZHEN) CO., LTD., Guangdong (CN)

(*) Notice: Subject to any disclaimer, the term of this patent is extended or adjusted under 35 U.S.C. 154(b) by 0 days.

(21) Appl. No.: 16/525,538

(22) Filed: Jul. 29, 2019

(65) Prior Publication Data

US 2020/0267479 A1    Aug. 20, 2020

Related U.S. Application Data

(60) Provisional application No. 62/807,252, filed on Feb. 19, 2019.

(51) Int. Cl.
| | | |
|---|---|---|
| *H01L 23/538* | (2006.01) | |
| *G01L 5/00* | (2006.01) | |
| *H01L 23/13* | (2006.01) | |
| *H01L 23/31* | (2006.01) | |
| *H04R 1/04* | (2006.01) | |

(Continued)

(52) U.S. Cl.
CPC .......... *H01L 23/5389* (2013.01); *B81B 7/008* (2013.01); *G01L 5/00* (2013.01); *H01L 23/13* (2013.01); *H01L 23/3121* (2013.01); *H01L 23/5385* (2013.01); *H01L 24/48* (2013.01); *H04R 1/04* (2013.01); *H04R 19/04* (2013.01); *B81B 2201/0257* (2013.01); *B81B 2207/07* (2013.01); *H01L 2224/48265* (2013.01); *H04R 2201/003* (2013.01)

(58) Field of Classification Search
CPC ........ H04R 19/005; H04R 19/04; H04R 3/00; H04R 3/005; H04R 1/04; H04R 2499/11; H04R 220/003; H04R 17/02; H04R 5/04; B81B 2201/0257; B81B 7/008; B81B 7/007; B81B 7/0061; B81B 7/0064; H01L 2224/48227
USPC ....... 381/174, 150, 355, 333, 306, 388, 334, 381/361, 365, 175, 374; 257/416, 704, 257/423, 724, 731, 774, 782; 29/594, 29/609.1
See application file for complete search history.

(56) References Cited

U.S. PATENT DOCUMENTS

2008/0144874 A1* 6/2008 Wu .......................... H04R 1/04
                                                  381/355
2014/0183671 A1* 7/2014 Kuratani ............... H01L 23/552
                                                  257/416

(Continued)

*Primary Examiner* — Alexander Krzystan
*Assistant Examiner* — Julie X Dang
(74) *Attorney, Agent, or Firm* — CKC & Partners Co., LLC

(57) ABSTRACT

A microphone package structure includes a substrate, a metal housing, a MEMS microphone component and at least one integrated circuit component. The substrate has a first surface and a second surface that are opposite to each other. The metal housing is located on the first surface such that the substrate and the metal housing collectively define a hollow chamber. The MEMS microphone component is located on the metal housing and within the hollow chamber. The at least one integrated circuit component is located within a region of the second surface on which the metal housing has a vertical projection.

12 Claims, 3 Drawing Sheets

(51) Int. Cl.
    *H04R 19/04*     (2006.01)
    *B81B 7/00*     (2006.01)
    *H01L 23/00*     (2006.01)

(56) References Cited

U.S. PATENT DOCUMENTS

| | | | | |
|---|---|---|---|---|
| 2014/0239438 A1* | 8/2014 | Kilger | ............... | H01L 24/24 257/528 |
| 2015/0256917 A1* | 9/2015 | Schelling | ............... | H04R 1/028 381/111 |
| 2016/0165358 A1* | 6/2016 | Ho | ............... | B81B 7/0061 257/416 |
| 2017/0164107 A1* | 6/2017 | Murgia | ............... | H04R 3/005 |
| 2019/0359481 A1* | 11/2019 | Lorenz | ............... | H04R 19/04 |

\* cited by examiner

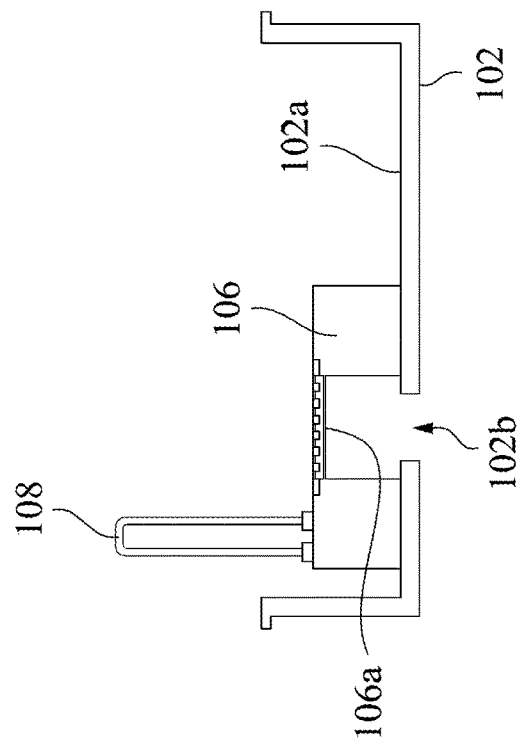
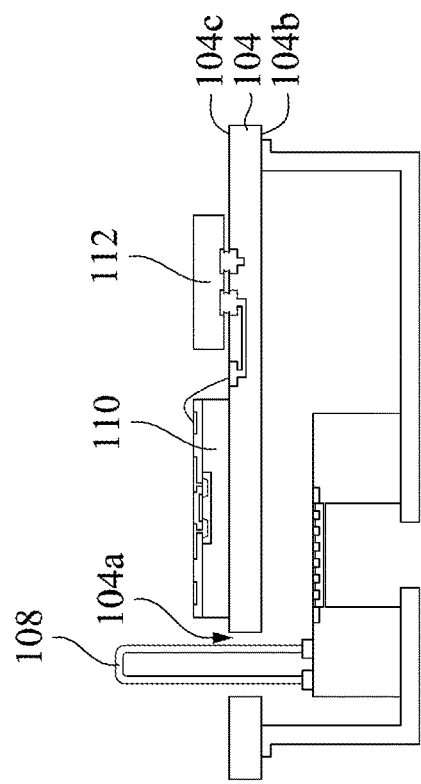
Fig. 2A
Fig. 2B

MICROPHONE PACKAGE STRUCTURE

CROSS-REFERENCE TO RELATED APPLICATION

This application claims priority to U.S. Provisional Application Ser. No. 62/807,252, filed Feb. 19, 2019, which is herein incorporated by reference in its entirety.

BACKGROUND

Field of Invention

The present disclosure relates to an electrical device package structure, and more particular to a microphone package structure.

Description of Related Art

In the current trend of shrinking the size of the electronic device, various components inside the electronic device is also required to be miniaturized, and the package structure of the microphone component is one of them. How to design a miniaturized microphone package structure and meet the performance requirements of the microphone component is one of the research directions developed by manufacturers.

SUMMARY

The present invention provides a microphone package structure to deal with the needs of the prior art problems.

In one or more embodiments, a microphone package structure includes a substrate, a metal housing, a MEMS microphone component and at least one integrated circuit component. The substrate has a first surface and a second surface that are opposite to each other. The metal housing is located on the first surface such that the substrate and the metal housing collectively define a hollow chamber. The MEMS microphone component is located on the metal housing and within the hollow chamber. The at least one integrated circuit component is located within a region of the second surface on which the metal housing has a vertical projection.

In one or more embodiments, the integrated circuit component is at least partially located within a region of the second surface on which the MEMS microphone component has a vertical projection.

In one or more embodiments, the metal housing has a through hole with which the MEMS microphone component is aligned.

In one or more embodiments, the microphone package structure further includes an encapsulation layer, and the substrate has a perforation hole, wherein the encapsulation layer covers the perforation hole and seals the at least one integrated circuit component on the second surface.

In one or more embodiments, the microphone package structure further includes two metal wires passing through the perforation hole and the encapsulation layer, and the two metal wires are electrically connected to the at least one integrated circuit component and the MEMS microphone component.

In one or more embodiments, the perforation hole is not located within a region of the substrate on which the at least one integrated circuit component has a vertical projection.

In one or more embodiments, the at least one integrated circuit component includes an acoustic signal processing component relatively close to the perforation hole and an electronic signal processing component relatively remote from the perforation hole.

In one or more embodiments, the acoustic signal processing component is at least partially located within a region of the second surface on which the MEMS microphone component has a vertical projection.

In one or more embodiments, the microphone package structure further includes a redistribution layer over the encapsulation layer, wherein the redistribution layer has a first conductive route connected to the acoustic signal processing component, a second conductive route connected to the electronic signal processing component and a grounded conductive route.

In one or more embodiments, the at least one integrated circuit component is electrically connected to the second surface of the substrate via a metal wire.

In one or more embodiments, the at least one integrated circuit component is flip-chip bonded on the second surface of the substrate via a metal wire.

In one or more embodiments, the at least one integrated circuit component includes a plurality of integrated circuit components located within the region of the second surface on which the metal housing has a vertical projection.

In one or more embodiments, the integrated circuit components includes a plurality of bonding pads located within the region of the second surface on which the metal housing has a vertical projection.

In sum, the microphone package structure disclosed herein includes its metal housing, integrated circuit component and MEMS microphone component overlapped on two opposite sides of the circuit substrate such that the package structure can be constructed on a smaller circuit substrate and an overall structure of the microphone package can be downsized or miniaturized.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 2A-2D illustrate cross-sectional views of steps for manufacturing a microphone package structure according to one embodiment of the present disclosure.

DETAILED DESCRIPTION

Figure 1:
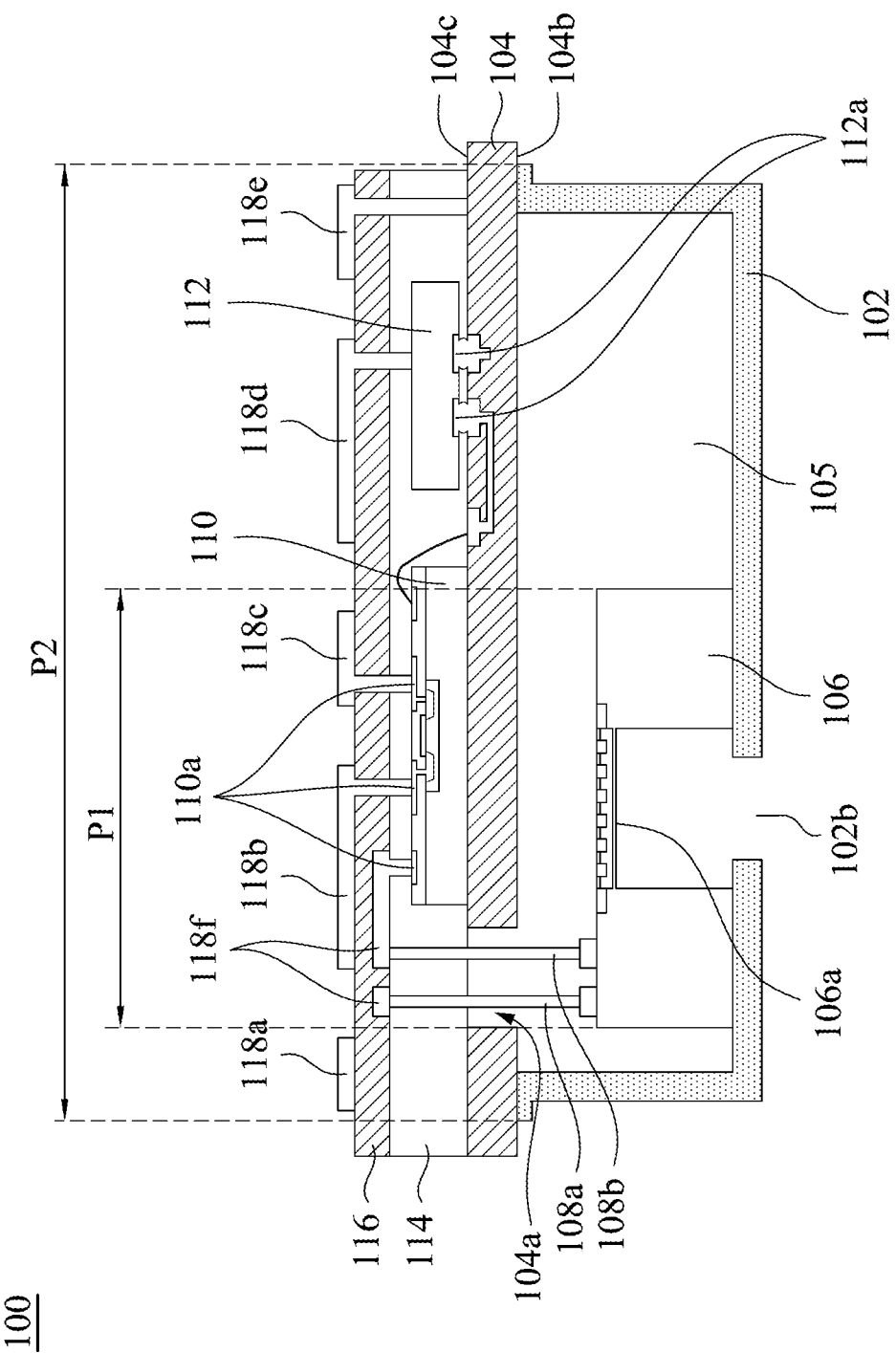
FIG. 1 illustrates a cross-sectional view of an microphone package structure according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1, which illustrates a cross-sectional view of a microphone package structure according to one embodiment of the present disclosure. A microphone package structure 100 includes a substrate 104, a metal housing 102, a Micro-Electro-Mechanical System (MEMS) microphone component 106 and at least one integrated circuit component (110,112). The substrate 104 can be a printed circuit board or other types of circuit board, and have two opposite surface 104b and surface 104c. The metal housing 102 is secured to the surface 104b of the substrate 104 such that the substrate 104 and the metal housing 102 can collectively define a hollow chamber 105. The MEMS microphone component 106 is secured to an inner surface 102a of the metal housing 102 and thus located within the hollow chamber 105. The integrated circuit component (110,112) is secured to the surface 104c of the substrate 104 and located a region (P2) of the surface 104c on which the metal housing 102 has a vertical projection. That is, the integrated circuit component (110,112) and the metal housing 102 are vertically overlapped or aligned. The MEMS microphone component 106 is located within the hollow chamber 105 and not eroded by external moisture even not otherwise sealed by an encapsulation layer. The vertical alignment configuration of the metal housing 102 and the integrated circuit components (110,112) is beneficial to use a smaller area of the substrate 104, and also contributes to the downsizing or miniaturization of the overall structure of the microphone package structure.

In this embodiment, the integrated circuit component 110 is at least partially located within a region (P1) of the surface 104c of the substrate 104 on which the MEMS microphone component 106 has a vertical projection. That is, the integrated circuit component 110 and the MEMS microphone component 106 are vertically overlapped or aligned. Such configuration is beneficial to use a smaller area of the substrate 104, and also contributes to the downsizing or miniaturization of the overall structure of the microphone package structure.

In this embodiment, two integrated circuit components (110,112) are secured to the surface 104c of the substrate 104, but more integrated circuit components may be secured to the surface 104c of the substrate 104.

In this embodiment, the metal housing 102 has a through hole 102b, and the MEMS microphone component 106 is secured to the metal housing 102 with its position aligned with the through hole 102b. The MEMS microphone component 106 is located within the hollow chamber 105 and not otherwise sealed by an encapsulation layer such that its operating parameters (such as the operating parameters of the diaphragm 106a) need not be recalibrated due to the sealing.

In this embodiment, the substrate 104 has a perforation hole 104a, and an encapsulation layer 114 covers the perforation hole 104a of the substrate 104 and seals the integrated circuit components (110,112) on the surface 104c of the substrate 104. Two metal wires (108a,108b) pass through the perforation hole 104a and the encapsulation layer 114 and are electrically connected to the integrated circuit component 110 and the MEMS microphone component 106.

In this embodiment, the integrated circuit component 110 may be an acoustic signal processing component, and the integrated circuit component 112 may be an electronic signal processing component, the integrated circuit component 110 is closer to the perforation hole 104a than the integrated circuit component 112 such that a signal conduction distance between the MEMS microphone component 106 and the corresponding acoustic signal processing component (e.g., the integrated circuit component 110) can be shortened as much as possible.

In this embodiment, the microphone package structure may include a redistribution layer 116 over the encapsulation layer 114. The redistribution layer 116 may have conductive routes (118b, 118c) electrically connected to the integrated circuit component 110, a conductive route 118d electrically connected to the integrated circuit component 112 and a grounded conductive route (118a or 118e).

In this embodiment, the integrated circuit component (110 or 112) is electrically connected to the surface 104c of the substrate 104 via metal wires, or flip-chip bonded on the surface 104c of the substrate 104, but not being limited thereto.

In this embodiment, the integrated circuit component (110 or 112) may have bonding pads (110a or 112a) located within the region (P2) of the surface 104c of the substrate 104 on which the metal housing 102 has a vertical projection.

Reference is made to FIGS. 2A-2D, which illustrate cross-sectional views of steps for manufacturing a microphone package structure according to one embodiment of the present disclosure.

In the step of FIG. 2A, a metal housing 102 with a through hole 102b is provided, and the MEMS microphone component 106 is secured to the surface 102a of the metal housing 102 and aligned with the through hole 102b (e.g., the diaphragm 106a of the MEMS microphone component 106 is aligned with the through hole 102b). A metal wire 108 has its two opposite ends secured to two electrodes of the MEMS microphone component 106.

In the step of FIG. 2B, a substrate 104 with a perforation hole 104a is provided. The metal housing 102 is secured to the surface 104b of the substrate 104 and the metal wire 108 is passed through the perforation hole 104a, and the MEMS microphone component 106 is located within the hollow chamber 105 formed by the substrate 104 and the metal housing 102. The integrated circuit components (110, 112) is first secured to the surface 104c of the substrate 104, bonding pads of the integrated circuit component 110 is electrically connected to the surface 104c of the substrate 104 via the metal wires, and the integrated circuit component 112 is flip-chip bonded on the surface 104c of the substrate 104. In order to easily pass the metal wires 108 through the perforation hole 104a, the perforation hole 104a should have a diameter more than twice the wire diameter of the metal wire 108.

Figure 2D:
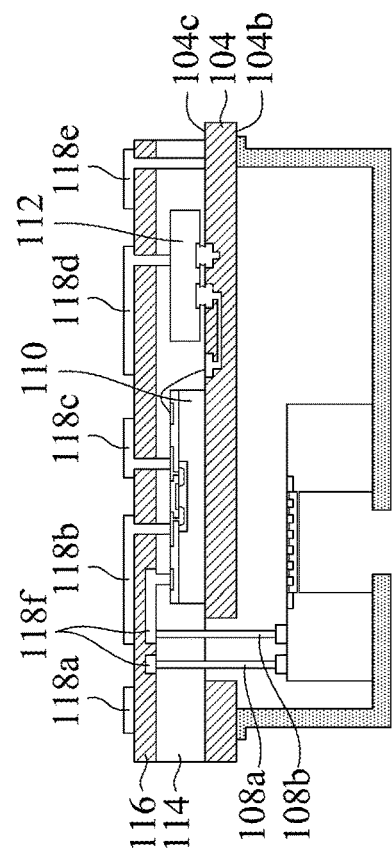
Figure 2C:
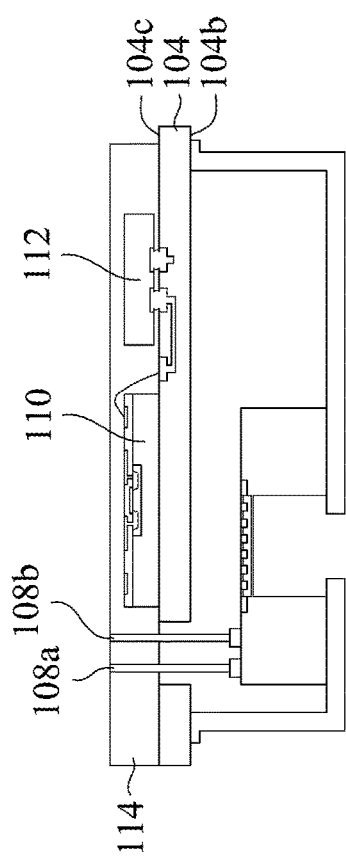

In the step of FIG. 2C, an encapsulation layer 114 is formed to cover the perforation hole 104a and seal the integrated circuit components (110, 112) on the surface 104c of the substrate 104, and an upper portion of the metal wire 108 that protrudes out of the encapsulation layer 114 is then removed to form two metal wires (108a, 108b) embedded in the encapsulation layer 114. In this embodiment, the perforation hole 104a is not located within a region of the substrate 104 on which the integrated circuit components (110, 112) have a vertical projection.

In the step of FIG. 2D, a redistribution layer 116 is formed over the encapsulation layer 114, the redistribution layer 116 may include conductive routes (118b, 118c) electrically connected to the integrated circuit component 110, a conductive route 118d electrically connected to the integrated circuit component 112 and a grounded conductive route (118a or 118e). An additional conductive route 118f is connected between the two metal wires (108a, 108b) and the integrated circuit component 110.

In sum, the microphone package structure disclosed herein includes its metal housing, integrated circuit component and MEMS microphone component overlapped on two opposite sides of the circuit substrate such that the package structure can be constructed on a smaller circuit substrate and an overall structure of the microphone package can be downsized or miniaturized.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A microphone package structure comprising:
a substrate having a first surface, a second surface that are opposite to each other and a perforation hole;
a metal housing disposed on the first surface such that the substrate and the metal housing collectively define a hollow chamber;
a Micro-Electro-Mechanical System (MEMS) microphone component disposed on the metal housing and within the hollow chamber;
at least one integrated circuit component disposed on the second surface of the substrate; and
an encapsulation layer covering the perforation hole and sealing the at least one integrated circuit component on the second surface of the substrate.

2. The microphone package structure of claim 1, wherein the integrated circuit component is at least partially located within a region of the second surface with which the MEMS microphone component is vertically aligned.

3. The microphone package structure of claim 1, wherein the metal housing has a through hole with which the MEMS microphone component is aligned.

4. The microphone package structure of claim 1 further comprising two metal wires passing through the perforation hole and the encapsulation layer, and the two metal wires are electrically connected to the at least one integrated circuit component and the MEMS microphone component.

5. The microphone package structure of claim 1, wherein the perforation hole is not located within a region of the substrate with which the at least one integrated circuit component is vertically aligned.

6. The microphone package structure of claim 1, wherein the at least one integrated circuit component comprises an acoustic signal processing component and an electronic signal processing component, wherein the acoustic signal processing component is closer to the perforation hole than the electronic signal processing component.

7. The microphone package structure of claim 6, wherein the acoustic signal processing component is at least partially located within a region of the second surface with which the MEMS microphone component is vertically aligned.

8. The microphone package structure of claim 6 further comprising a redistribution layer over the encapsulation layer, wherein the redistribution layer has a first conductive route connected to the acoustic signal processing component, a second conductive route connected to the electronic signal processing component and a grounded conductive route.

9. The microphone package structure of claim 1, wherein the at least one integrated circuit component is electrically connected to the second surface of the substrate via a metal wire.

10. The microphone package structure of claim 1, wherein the at least one integrated circuit component is flip-chip bonded on the second surface of the substrate via a metal wire.

11. The microphone package structure of claim 1, further comprising additional integrated circuit components located within the region of the second surface with which the metal housing is vertically aligned.

12. The microphone package structure of claim 11, wherein the integrated circuit components comprise a plurality of bonding pads located within the region of the second surface with which the metal housing is vertically aligned.

* * * * *